US012584207B2

(12) United States Patent
Hong et al.

(10) Patent No.: US 12,584,207 B2
(45) Date of Patent: Mar. 24, 2026

(54) METHOD OF DEPOSITING AN ALUMINUM NITRIDE (AlN) THIN FILM

(71) Applicant: KOREA ELECTRONICS TECHNOLOGY INSTITUTE, Seongnam-si (KR)

(72) Inventors: Sungmin Hong, Yongin-si (KR); Hyungman Lee, Seongnam-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 0 days.

(21) Appl. No.: 17/505,710

(22) Filed: Oct. 20, 2021

(65) Prior Publication Data

US 2022/0119936 A1     Apr. 21, 2022

(30) Foreign Application Priority Data

Oct. 20, 2020     (KR) ......................... 10-2020-0136159

(51) Int. Cl.
*C23C 14/06*          (2006.01)
*C23C 14/34*          (2006.01)
(Continued)

(52) U.S. Cl.
CPC ........ *C23C 14/0617* (2013.01); *C23C 14/345* (2013.01); *G01N 29/2437* (2013.01); *H10N 30/076* (2023.02)

(58) Field of Classification Search
CPC . C23C 14/0617; C23C 14/345; C23C 14/024; C23C 14/0036; C23C 14/226;
(Continued)

(56) References Cited

U.S. PATENT DOCUMENTS

| | | | | |
|---|---|---|---|---|
| 4,537,814 A | * | 8/1985 | Itoh ........................ | H05B 33/22 |
| | | | | 428/521 |
| 4,640,756 A | * | 2/1987 | Wang .................... | C23C 14/225 |
| | | | | 204/192.18 |

(Continued)

FOREIGN PATENT DOCUMENTS

| | | | |
|---|---|---|---|
| KR | 10-2003-0037223 A | 5/2003 |
| KR | 10-2004-0024495 A | 3/2004 |
| KR | 10-2016-0124796 A | 10/2016 |

OTHER PUBLICATIONS

Office Action issued on Jan. 20, 2022, for corresponding Korean Patent Application No. 10-2020-0136159; with English machine translation.

*Primary Examiner* — Patrick S Ott
(74) *Attorney, Agent, or Firm* — Hauptman Ham, LLP

(57)          ABSTRACT

A method of depositing an AlN thin film according to an embodiment of the disclosure comprises: a step of forming an insulating layer on a base substrate; and a step of depositing an AlN thin film on the insulating layer through a sputtering process, wherein the step of depositing the AlN thin film is performed through a continuous deposition type, at lower than a CMOS-compatible process temperature and in a state of applying a bias positive voltage to the base substrate such that the AlN thin film has an adjustable deposition thickness. Therefore, an embodiment of the disclosure is advantageous in that an AlN thin film having excellent piezo characteristics can be obtained at a low process temperature compatible with a CMOS process.

8 Claims, 16 Drawing Sheets

(51) Int. Cl.
    *G01N 29/24*       (2006.01)
    *H10N 30/076*     (2023.01)

(58) Field of Classification Search
    CPC .... G01N 29/2437; H01L 41/316; H03H 3/02;
                            H03H 9/54; H01J 37/3408
    See application file for complete search history.

(56)            References Cited

U.S. PATENT DOCUMENTS

| | | | | |
|---|---|---|---|---|
| 5,856,690 | A * | 1/1999 | Burns | ............... H01L 29/66825 |
| | | | | 257/E29.151 |
| 5,897,977 | A * | 4/1999 | Carcia | ....................... G03F 1/32 |
| | | | | 430/5 |
| 11,005,025 | B1 * | 5/2021 | Horsley | ............. G01N 29/2437 |
| 2004/0050687 | A1 | 3/2004 | Lee et al. | |
| 2004/0188241 | A1 | 9/2004 | Rich et al. | |
| 2005/0218488 | A1 * | 10/2005 | Matsuo | ............... G01P 15/0802 |
| | | | | 257/678 |
| 2009/0246385 | A1 * | 10/2009 | Felmetsger | ......... C23C 14/0617 |
| | | | | 204/192.18 |
| 2012/0127659 | A1 * | 5/2012 | Chen | ................... H01L 23/3738 |
| | | | | 165/185 |
| 2015/0165479 | A1 * | 6/2015 | Lasiter | ............... H10N 30/2047 |
| | | | | 29/25.35 |
| 2016/0093491 | A1 * | 3/2016 | Choi | ................. H01L 29/78681 |
| | | | | 438/479 |
| 2016/0172578 | A1 * | 6/2016 | Valbin | .................. H10N 30/302 |
| | | | | 600/300 |
| 2017/0077141 | A1 | 3/2017 | Kawai et al. | |
| 2017/0111028 | A1 * | 4/2017 | McCarron | ............... H03H 3/02 |
| 2017/0145588 | A1 * | 5/2017 | Daigo | ................ C23C 14/0617 |
| 2017/0294294 | A1 * | 10/2017 | Haymore | .......... H01J 37/32706 |
| 2018/0019728 | A1 * | 1/2018 | Kaajakari | ............ H10N 30/853 |
| 2018/0107854 | A1 * | 4/2018 | Tsai | .................... B81C 1/00238 |
| 2018/0230586 | A1 * | 8/2018 | Wang | ................. C23C 14/0641 |
| 2018/0312399 | A1 * | 11/2018 | Singh | .................. B81C 1/00039 |
| 2019/0267536 | A1 * | 8/2019 | Apte | ..................... B06B 1/0662 |
| 2020/0052190 | A1 * | 2/2020 | Nahm | ............... H10N 30/8542 |

* cited by examiner

METHOD OF DEPOSITING AN ALUMINUM NITRIDE (AlN) THIN FILM

CROSS-REFERENCE TO RELATED APPLICATION(S)

This application is based on and claims priority under 35 U.S.C. 119 to Korean Patent Application No. 10-2020-0136159, filed on Oct. 20, 2020, in the Korean Intellectual Property Office, the disclosure of which is herein incorporated by reference in its entirety.

BACKGROUND

1) Field

The disclosure relates to a method of depositing an aluminum nitride (AlN) thin film and, more specifically, to a method of depositing an AlN thin film capable of improving piezo characteristics of an AlN thin film by applying a voltage to a base substrate.

2) Description of Related Art

AlN is not harmful to human bodies and have a stable dielectric constant, a high quality factor, and a high coupling coefficient. Therefore, AlN is applicable to various fields such as surface acoustic wave elements using piezoelectric characteristics, and bulk acoustic wave resonators. In addition, AlN thin films have high electric resistance and low deposition temperature characteristics and thus are considered as the most useful piezoelectric materials compatible with CMOS processes.

In general, compatibility with CMOS processes requires low heat treatment temperatures (400° C. or lower) and surface micro-processing technologies. Therefore, low-temperature deposition of AlN as insulating layers and piezoelectric materials by using sputters not only makes it possible to directly fabricate an MEMS-type MPG on an IC chip as a post-treatment process, but also enables compatibility with batch processes and CMOS processes.

There exist sensors of two-chip types obtained by separately fabricating a CMOS chip and an AlN thin film-based sensor (for example, PMUT (Piezoelectric Micromachined Ultrasonic Transducers) sensor). As a method for obtaining an AlN(002) surface having high piezo characteristics at low process temperatures, Mo is used as a low substrate, or the surface of Mo is modified. Alternatively, a negative voltage is applied to the substrate as disclosed in Korean Laid-Open Patent Publication No. 10-2003-0037223. However, in order to obtain a desired level of piezo characteristics, the temperature of AlN thin film processes inevitably rises, and it is thus difficult or impossible to implement a one-chip type CMOS/AlN thin film manufacturing process to date. Therefore, there is a need for a method for obtaining an AlN thin film having excellent piezo characteristics at a low process temperature compatible with a CMOS process.

The above information is presented as background information only to assist with an understanding of the disclosure. No determination has been made, and no assertion is made, as to whether any of the above might be applicable as prior art with regard to the disclosure.

SUMMARY

The disclosure has been made to solve the above-mentioned problems occurring in the prior art, and may provide a method of depositing an AlN thin film capable of improving piezo characteristics of an AlN thin film by applying a bias positive voltage to a base substrate.

A method of depositing an AlN thin film according to a first aspect of the disclosure includes: forming an insulating layer on a base substrate; and depositing an AlN thin film on the insulating layer through a sputtering process, wherein the depositing of the AlN thin film is performed below a CMOS-compatible process temperature in a continuous deposition type in a state of applying a bias positive voltage to the base substrate such that the AlN thin film has an adjustable deposition thickness.

A method of depositing an AlN thin film according to a second aspect of the disclosure includes: forming an insulating layer on a base substrate; forming a seed layer for growing an AlN thin film on the insulating layer; and depositing the AlN thin film on the seed layer through a sputtering process, wherein the depositing of the AlN thin film is performed below a CMOS-compatible process temperature in a continuous deposition type in a state of applying a bias positive voltage to the base substrate such that the AlN thin film has an adjustable deposition thickness.

A method of depositing an AlN thin film according to an embodiment of the disclosure provides the following advantageous effects:

1. Growth of an AlN(002) surface having excellent piezo characteristics can be secure even if the same is manufactured at a low temperature compatible with a CMOS process.

2. It is possible to manufacture a one-chip type sensor device of a sensor using a CMOS and an AlN thin film later through a process compatible with CMOS process.

3. An AlN(002) surface having excellent piezo characteristics can be fabricated regardless of the electrode material, or regardless of whether a lower electrode exists. Accordingly, a horizontal sensor structure can be fabricated instead of the existing vertical sensor structure, thereby facilitating sensor fabrication.

BRIEF DESCRIPTION OF THE DRAWINGS

For a more complete understanding of the disclosure and its advantages, reference is now made to the following description taken in conjunction with the accompanying drawings, in which like reference numerals represent like parts.

DETAILED DESCRIPTION

Hereinafter, embodiments of the disclosure will be particularly described with reference to the accompanying drawings. However, the description described below is not intended to limit the disclosure to particular embodiments. Further, when it is determined that a detailed description for the known technology related to the disclosure may obscure the gist of the disclosure, the detailed description thereof will be omitted.

Figure 1:
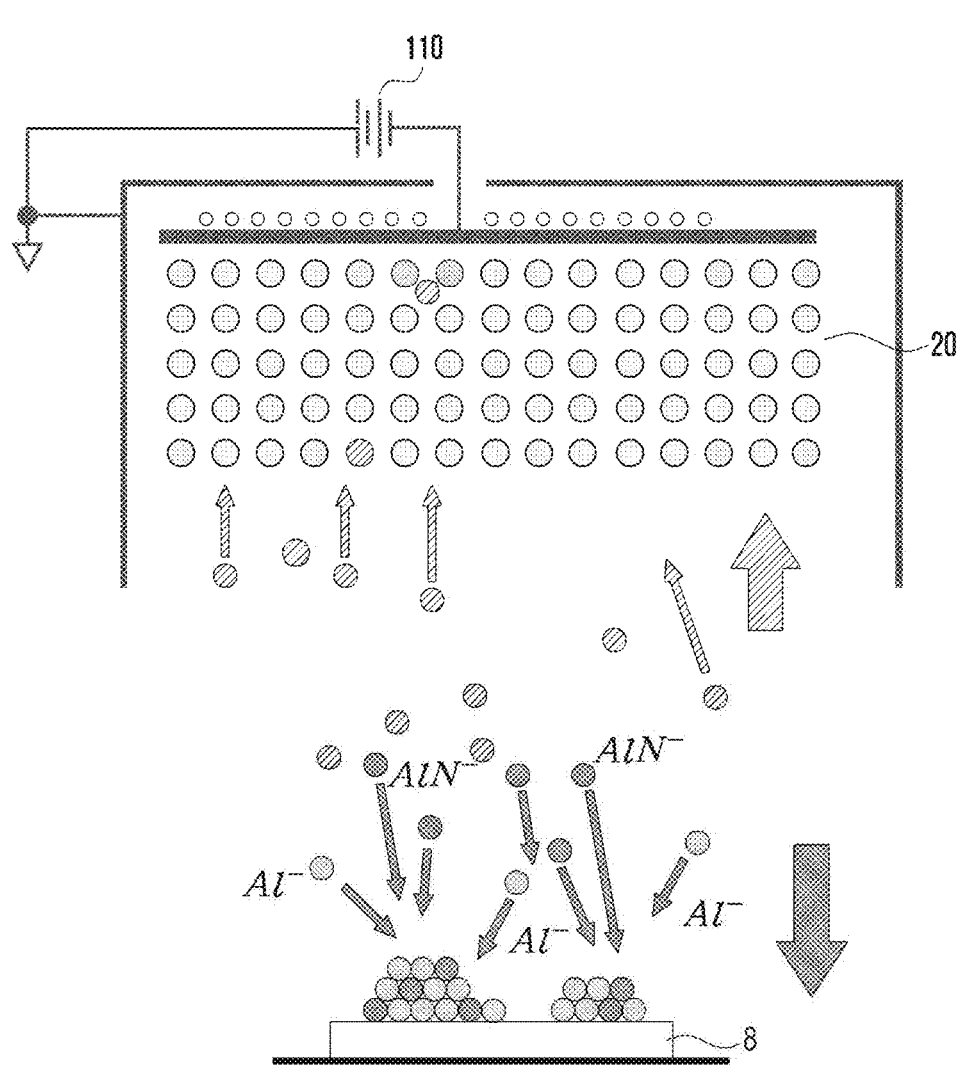
FIG. 1 is a schematic view of a conventional DC magnetron sputtering device.

FIG. 1 is a schematic view of a conventional DC magnetron sputtering device.

A conventional DC magnetron sputtering device 100 applies a negative voltage 110 to only a target 20 so as to form a plasma and perform a sputtering process, and therefore is a general sputtering device widely used. Each of two targets formed by an aluminum (Al) target and a molybdenum (Mo) target is mounted thereto, and an aluminum nitride (AlN) thin film may be manufactured while maintaining a vacuum state after a Mo metal electrode is deposited. In a normal case, two targets are provided therein, and it may be possible that the temperature of a base substrate is up to about 600° C. By using the conventional device, generally, a Mo electrode is used for a scheme to improve a piezoelectric property of an AlN thin film, or a base substrate 8 is applied with a negative voltage in order to apply an electron and ion flux thereto.

Figure 2:
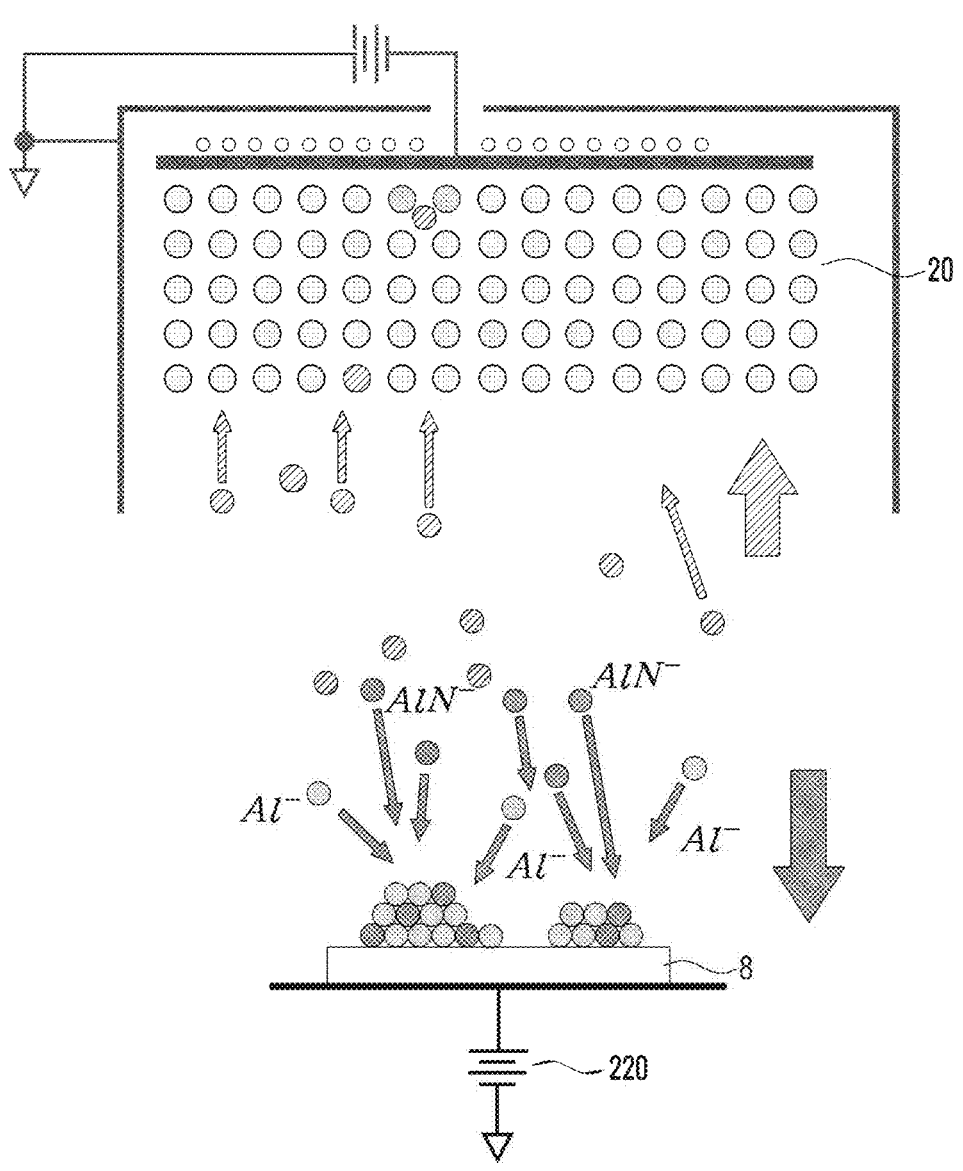
FIG. 2 is a schematic view of an improved DC magnetron sputtering device according to an embodiment of the disclosure.
Figure 3:
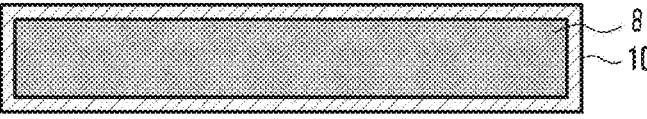
FIG. 3 is a view illustrating a method of manufacturing an AlN thin film according to an embodiment of the disclosure, which is performed using an improved DC magnetron sputtering device according to an embodiment of the disclosure illustrated in FIG. 2.
Figure 3:
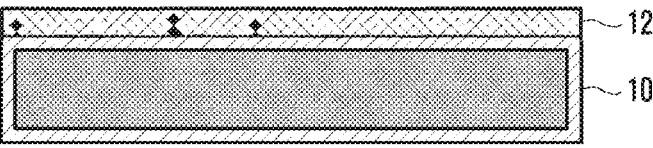
Figure 3:
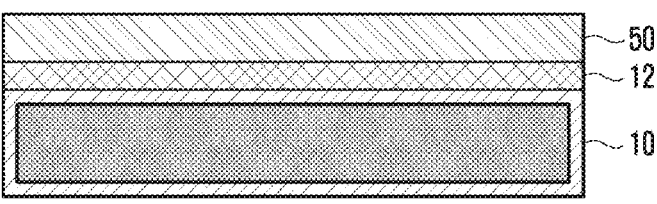

FIG. 2 is a schematic view of an improved DC magnetron sputtering device according to an embodiment of the disclosure, and FIG. 3 is a view illustrating a method of manufacturing an AlN thin film according to an embodiment of the disclosure, which is performed using an improved DC magnetron sputtering device according to an embodiment of the disclosure illustrated in FIG. 2, wherein FIG. 2 and FIG. 3 are illustrated from a top to a bottom according to a process progress.

Referring to FIG. 2 and FIG. 3, differently from the conventional DC magnetron sputtering device 100, an improved DC magnetron sputtering device 200 according to an embodiment of the disclosure may be characterized by applying a bias positive voltage 220 to a base substrate 8, more particularly, to a holder of the base substrate 8, and the applied bias positive voltage may be used as an acceleration voltage for an AlN thin film deposition.

A method of depositing an AlN thin film according to an embodiment of the disclosure may be characterized by: a step of forming an insulating layer 10 on the base substrate 8; and a step of depositing an AlN thin film 50 on the insulating layer 10 through a sputtering process, wherein the step of depositing the AlN thin film 50 is performed below a CMOS-compatible process temperature in a continuous deposition type in a state of applying the bias positive voltage 220 to the base substrate 8 such that the AlN thin film has an adjustable deposition thickness.

A method of depositing an AlN thin film according to another embodiment of the disclosure may be characterized by: a step of forming an insulating layer 10 on the base substrate 8; a step of forming a seed layer 12 for growing the AlN thin film 50 on the insulating layer 10; and a step of depositing the AlN thin film 50 on the seed layer 12 through a sputtering process, wherein the step of depositing the AlN thin film is performed below a CMOS process-compatible temperature in a continuous deposition type in a state of applying a bias positive voltage 220 to the base substrate 8 such that the AlN thin film has an adjustable deposition thickness.

The above-mentioned method of manufacturing an AlN thin film according to embodiments of the disclosure may be applied when directly depositing the AlN thin film on a complementary metal-oxide semiconductor (CMOS) chip used as a base substrate described below.

Referring to FIG. 2 and FIG. 3 again, the AlN thin film manufacturing method according to an embodiment of the disclosure will be specifically described.

More particularly, according to a method of manufacturing an AlN thin film according to an embodiment of the disclosure, firstly, the base substrate 8 may be prepared. For example, the base substrate 8 may be a silicon nitride (SiN) substrate obtained by, after piranha-cleaning a silicon (Si) wafer having a Si(100) surface, in order to reduce a distortion effect, depositing 5000 Å of a SiN thin film having a low stress thereon through a low pressure chemical vapor deposition (LPCVD) method, or may be a CMOS substrate. Subsequently, the prepared base substrate 8 is loaded in the DC magnetron sputtering device 200 illustrated in FIG. 2, and a temperature of the base substrate 8 is maintained below a temperature compatible with a CMOS process. In order to remove impurities contained in Al (when a seed layer is not formed) or Al and Mo (when a seed layer is formed) used as a sputtering target, a pre-sputtering process is performed, the ratio of argon (Ar) gas to nitrogen (N) gas is set to 1:2, and an operation pressure is maintained at 10 mTorr. In a process, in a case of forming a seed layer, a sputtering process is generally performed to form a thickness of 1000 Å under a predetermined process condition. In the method of manufacturing an AlN thin film according to the disclosure, it should be noted that the process of forming a seed layer may be selectively performed. Subsequently, power (hereinafter, referred to a sputter target power) applied to a target is preset at a predetermined value to perform a sputtering process to deposit an AlN thin film, and simultaneously a predetermined acceleration voltage is applied to a metal holder of a substrate.

According to an embodiment of the disclosure, the temperature compatible with a CMOS process may be equal to or more than 250° C. and less than 350° C., and, more preferably, may be within the range of 280-300° C. In the method of manufacturing an AlN thin film according to an embodiment of the disclosure, the sputter target power of a preset predetermined value may correspond to the range of 100-600 W, preferably, may be within the range of 200-400 W, more preferably, may be within the range of 250-300 W, and, the most preferably, may be 300 W. In the method of manufacturing an AlN thin film according to an embodiment of the disclosure, the predetermined acceleration voltage, which is applied to the metal holder of the base substrate, may be a bias positive voltage, and preferably, may be within the range of 0-100 V. More generally, the acceleration voltage may be within a range of 5-15% of the preset sputter target power, and more preferably, may be within a range of 8-12% of the preset sputter target power.

A deposition thickness of an AlN thin film may be related to a piezoelectric property, and more particularly, the piezoelectric property may be better as the thickness of the thin film thereof thickens. However, an AlN(002) surface of the deposited AlN thin film most greatly affects the piezoelectric property, and the AlN(002) surface should be vertically grown to have an excellent piezoelectric property when the thin film thereof is deposited. According to a preferable embodiment of the disclosure, the deposition thickness of an AlN thin film may be adjusted to have a predetermined thickness satisfying vertical growth conditions of the above-mentioned AlN(002) surface. In an embodiment, the predetermined thickness may be at least 1 μm or more.

According to an embodiment of the disclosure, the depositing of an AlN thin film may be performed in a continuous deposition type. The AlN thin film may be uniformly formed through the continuous deposition type so as to improve a piezoelectric property.

Figure 4A:
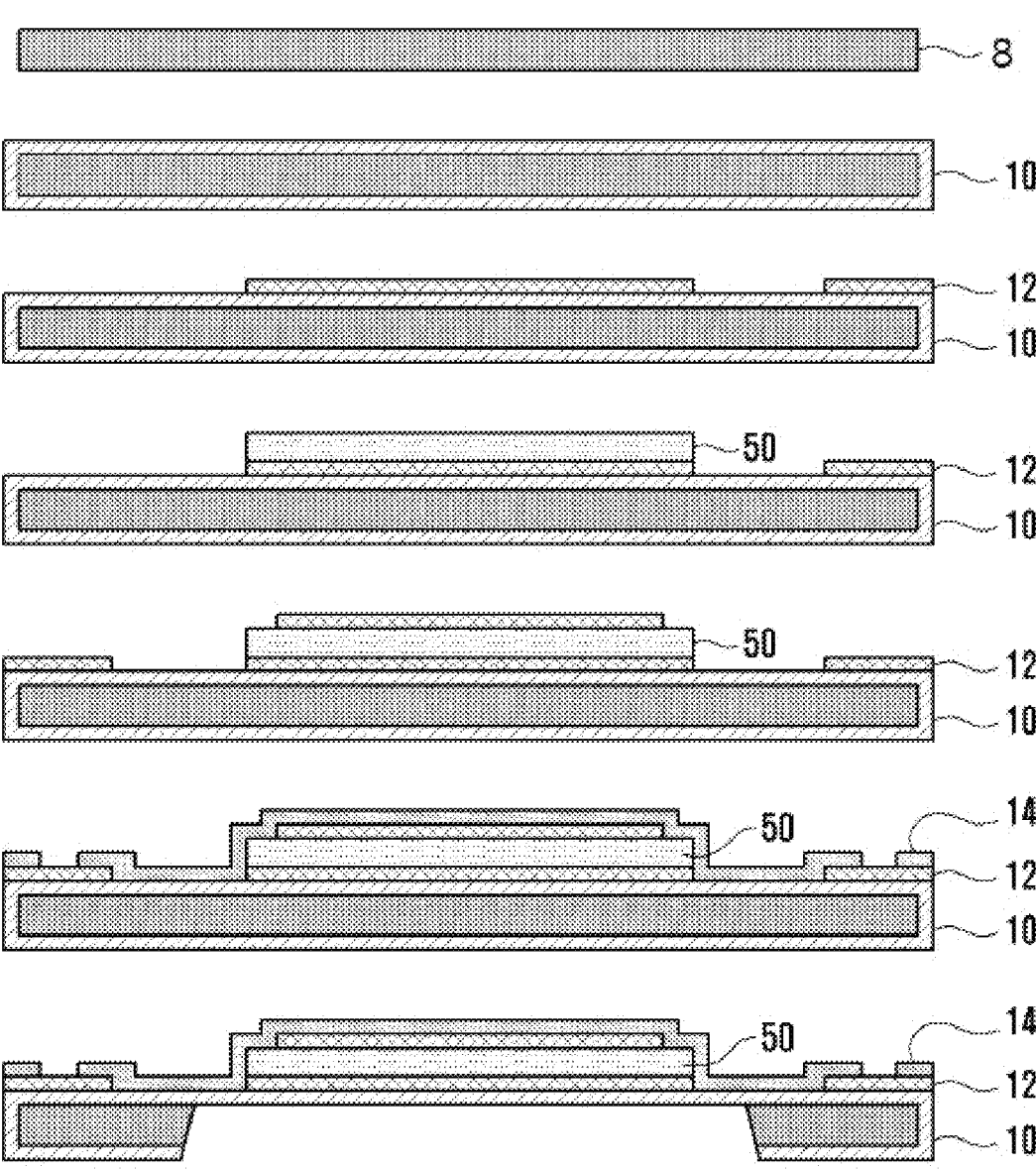
FIG. 4A and FIG. 4B are views illustrating a structure of a sensor employing an AlN thin film.
Figure 4B:
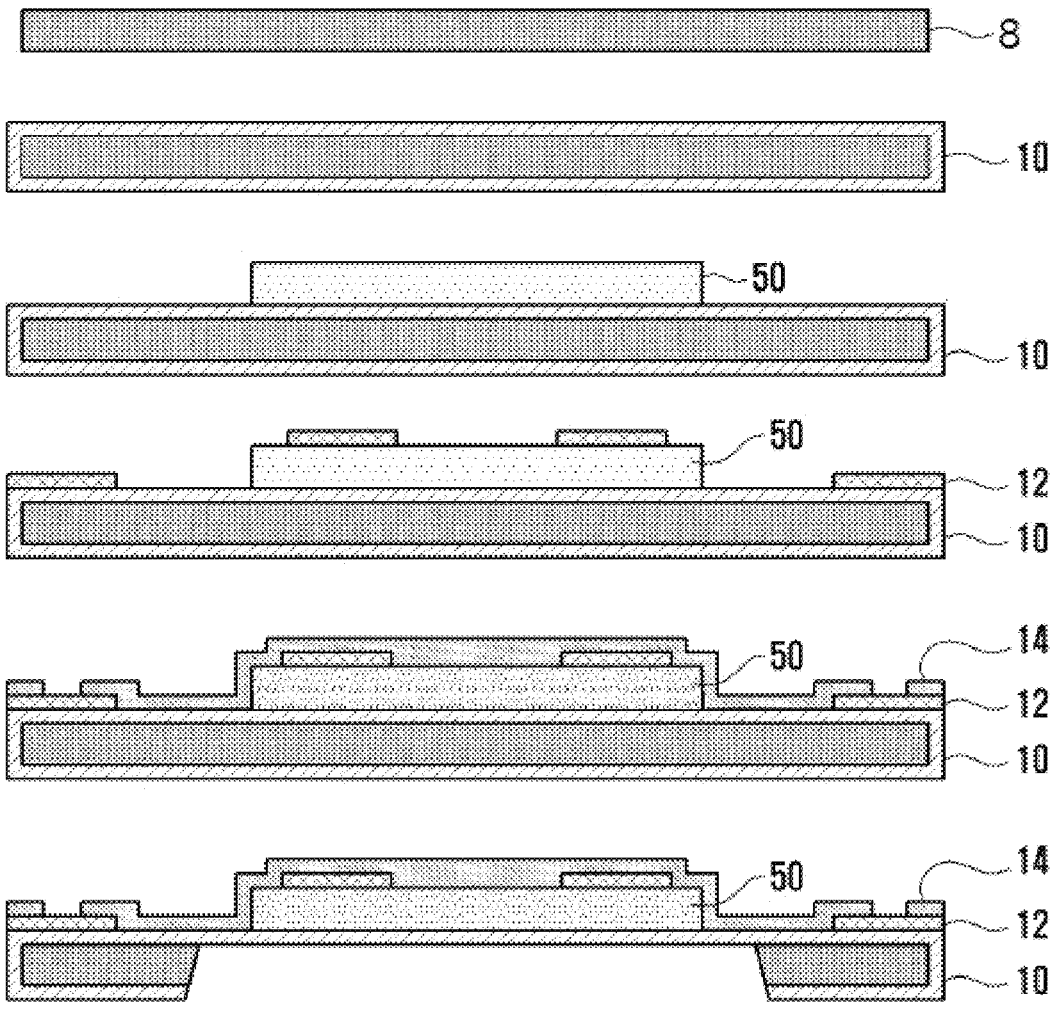

FIG. 4A and FIG. 4B are views illustrating a structure of a sensor employing an AlN thin film, particularly, are views illustrating an upper/lower electrode structure (FIG. 4A) and an upper electrode structure (FIG. 4B), respectively, and illustrate from the top to the bottom according to a process progress as the FIG. 3.

Generally, a structure of a sensor employing an AlN thin film, as the FIG. 4A, is a structure in which the metal electrode 12 is provided on each of the upper portion and the lower portion of the AlN thin film 50 so as to drive same, or, as the FIG. 4B, is a structure in which the metal electrode 12 is provided on the upper portion of the AlN thin film 50 so as to drive a sensor or a transducer.

More particularly, the structure of a sensor illustrated in FIG. 4A shows that, being separately manufactured on the upper portion of the base substrate 8, the AlN thin film 50 having the metal electrode 12 formed on the upper and the lower portion thereof is provided thereon and then an oxide film 14 is formed on the upper portion thereof. The structure of a sensor illustrated in FIG. 4B shows that, being separately manufactured on the upper portion of the base substrate 8, the AlN thin film 50 having the metal electrode 12 formed on only the upper portion thereof is provided thereon and then the oxide film 14 is formed on the upper portion thereof.

As illustrated in FIG. 4A and FIG. 4B, in a case where the AlN thin film 50 is formed using the Mo metal electrode 12 (a lower electrode) formed on the lower portion thereof as the seed layer 12, what growing an AlN(002) surface has a disadvantage in that there is a difficulty in being utilized in a sensor or a transducer employing two electrodes on the upper portion thereof. Therefore, as the method of manufacturing an AlN thin film according to an embodiment of the disclosure, it is an additional advantage of the disclosure that the growth of the AlN(002) surface is possible regardless of the existence and nonexistence of the lower electrode used as the seed layer 12.

FIG. 5 to FIG. 9B are views showing analysis results with respect to AlN thin films manufactured under a predetermined condition.

According to an embodiment of the disclosure, a predetermined condition may include a sputter target power, an acceleration voltage applied to a substrate metal holder, an operation pressure, an in-situ annealing temperature (referred as a temperature in Table 1), and a thickness of an AlN thin film, and the temperature and the acceleration voltage of the exemplary conditions may be set as the below Table value.

6

TABLE 1

| Classification | Temperature (° C.) | Acceleration voltage (V) |
|---|---|---|
| Condition 1 | 500 | 0 |
| Condition 2 | 300 | 0 |
| Condition 3 | 300 | 10 |
| Condition 4 | 300 | 30 |

Here, an AlN thin film has been manufactured and analyzed under the condition 1 to the condition 4 in Table 1 and common conditions that a sputter target power is 300 W (0.89 A, 337 V), an operation pressure is 10 mTorr, and a thickness of an AlN thin film is 1 μm.

Through the comparison the condition 1 with the condition 2, the difference in growth of AlN(002) surfaces according to a temperature may be identified. Through the comparison of the condition 2, the condition 3, and the condition 4, it is possible to identify the difference in growth of AlN(002) surfaces according to an acceleration voltage (that is, a bias positive voltage) applied to a base substrate metal holder.

Figure 5:
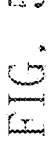
FIG. 5 is a graph showing an XRD analysis result with respect to AlN thin films manufactured under a predetermined condition.

FIG. 5 is an X-ray diffraction (XRD) analysis result with respect to AlN thin films manufactured based on the above-mentioned condition 1 to condition 4 and common conditions.

Referring to FIG. 5, in growth of AlN(002) surfaces, if an acceleration voltage is applied, even though an AlN thin film is deposited while maintaining the base substrate temperature of 300° C., it may be identified that the above result is similar to the result for the AlN thin film deposition under the condition of 500° C. of temperature of the base substrate in a case without an acceleration voltage.

Figure 6:
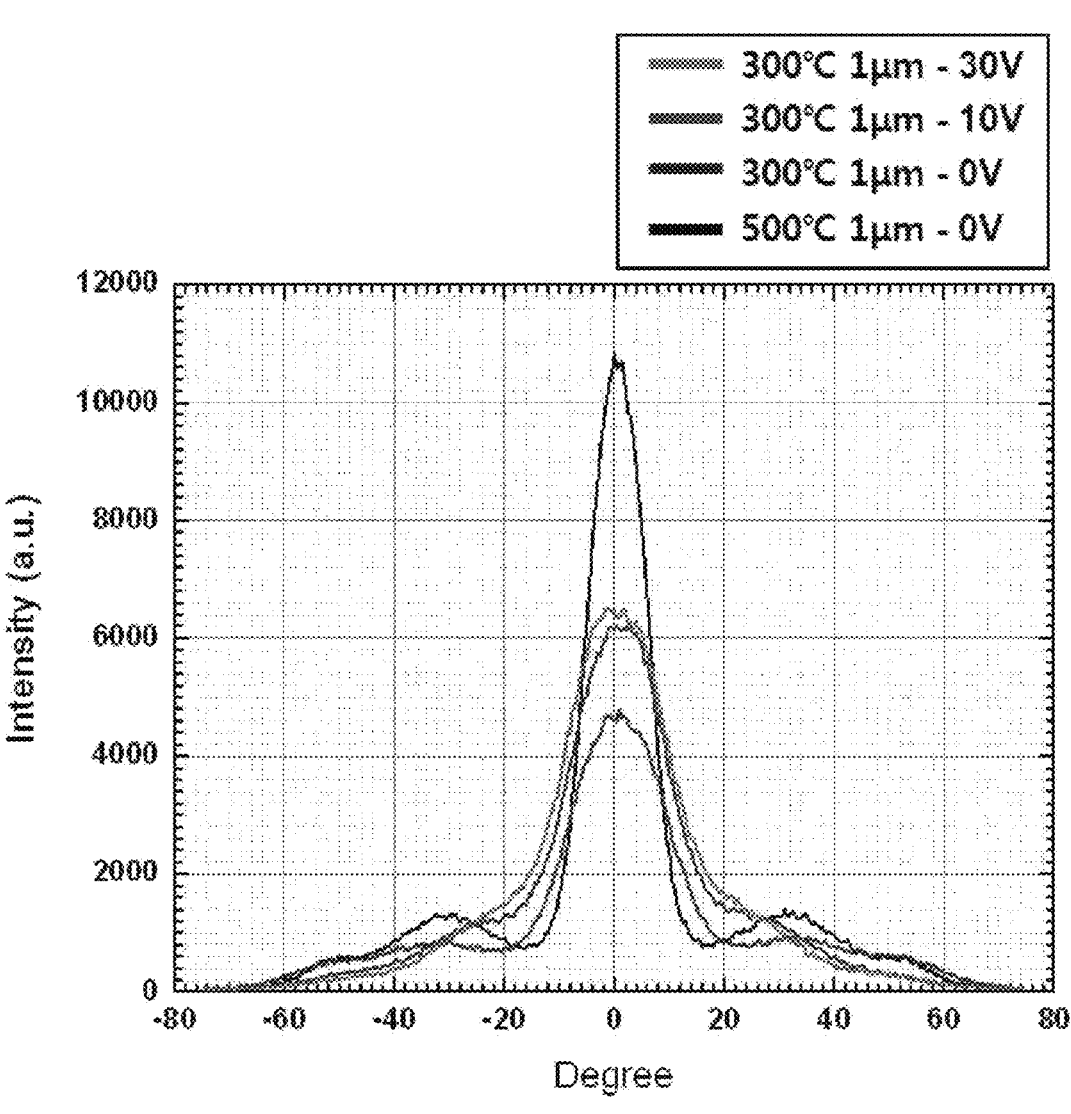
FIG. 6 is a graph showing a result of measuring rocking curves of AlN thin films manufactured under a predetermined condition.

FIG. 6 illustrates a result of measuring rocking curves of AlN thin films manufactured based on the above-mentioned condition 1 to condition 4 and common conditions.

Referring to FIG. 6, in 300° C. lower than a temperature compatible with a CMOS process, as the magnitude of an acceleration voltage increases, it shows that the above result is similar characteristic to the result in which the temperature of a base substrate temperature is 500° C. in a case without an acceleration voltage, and it may be identified that the crystal growth of AlN(002) surface increases as the acceleration voltage increases.

Figure 7A:
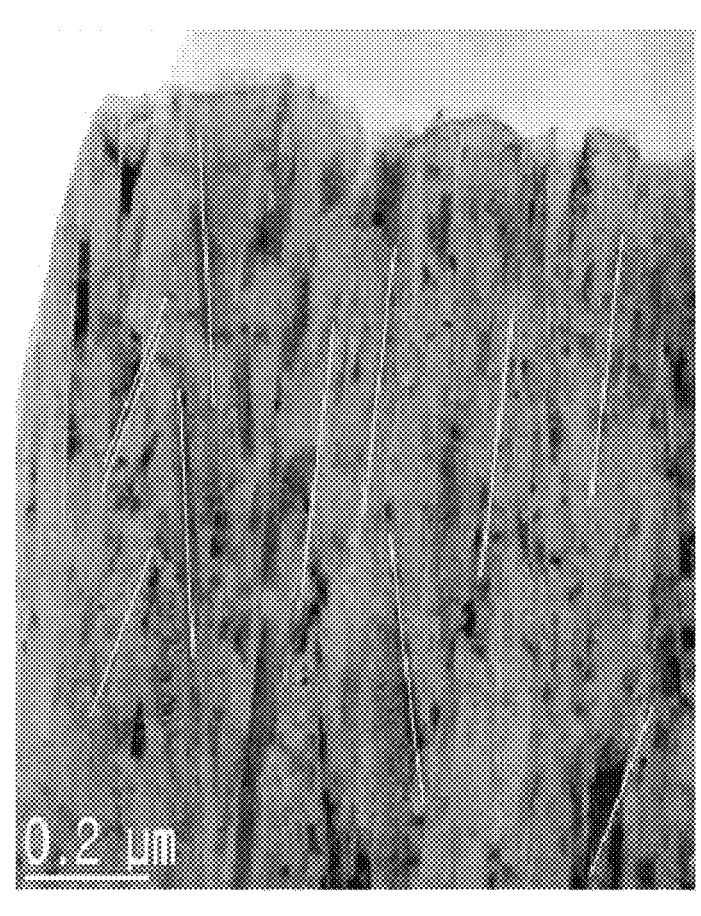
FIG. 7A to FIG. 7C are views showing a TEM analysis result with respect to AlN thin films manufactured under a predetermined condition.
Figure 7B:
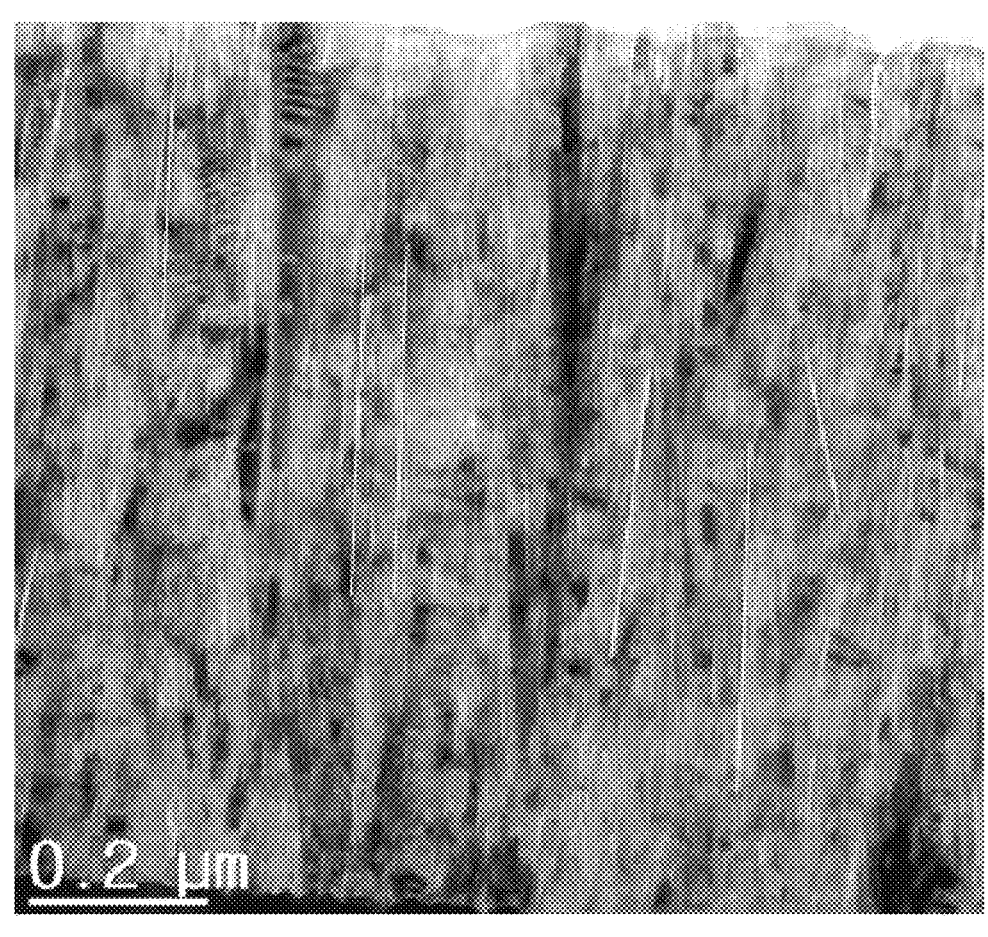
Figure 7C:
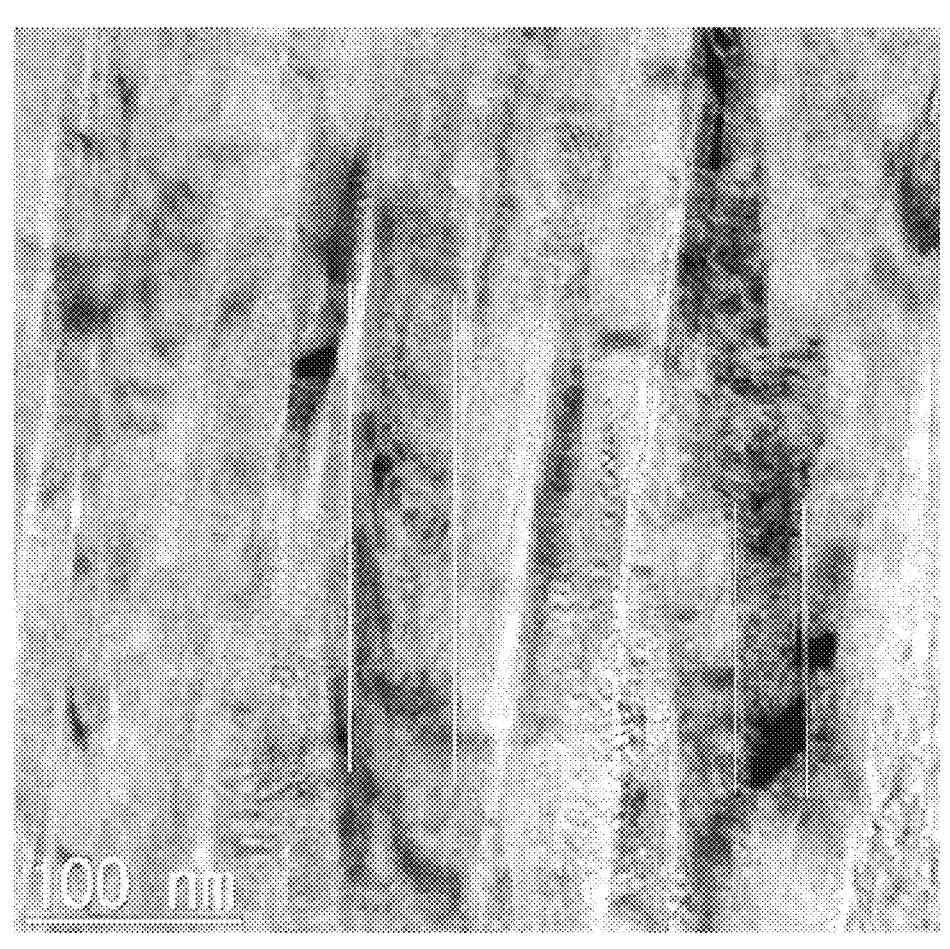

FIG. 7A to FIG. 7C are a transmission electron microscope (TEM) analysis result with respect to AlN thin films manufactured based on the above-mentioned condition 1 to condition 4 and common conditions.

Referring to FIG. 7A to FIG. 7C, FIG. 7A corresponds to the condition 2 (300° C., 0V), FIG. 7B corresponds to the condition 4 (300° C., 30V), and FIG. 7C corresponds to the condition 1 (500° C., 0V). Referring to the yellow lines illustrated in FIG. 7A to FIG. 7C, in the case (FIG. 7A) where an acceleration voltage is not applied when an AlN thin film is deposited, it may be identified that an AlN(002) surface is grown in a random direction other than a direction perpendicular to a substrate. In addition, even though the temperature of a substrate, which is 300° C., is low, in the case (FIG. 7B) where 30V as an acceleration voltage is applied, it may be identified that an AlN(002) surface is grown with 90 angles with respect to a substrate similarly to the condition (FIG. 7C) that the temperature of a substrate is 500° C.

Figure 8A:
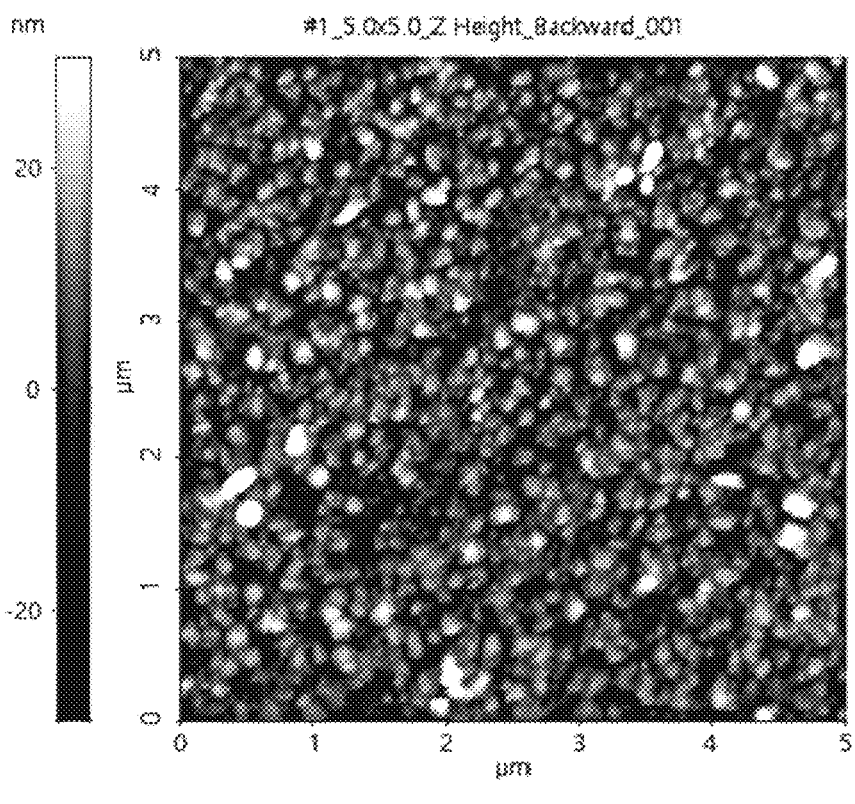
FIG. 8A to FIG. 8C are views showing a SEM analysis result with respect to AlN thin films manufactured under a predetermined condition.
Figure 8A:
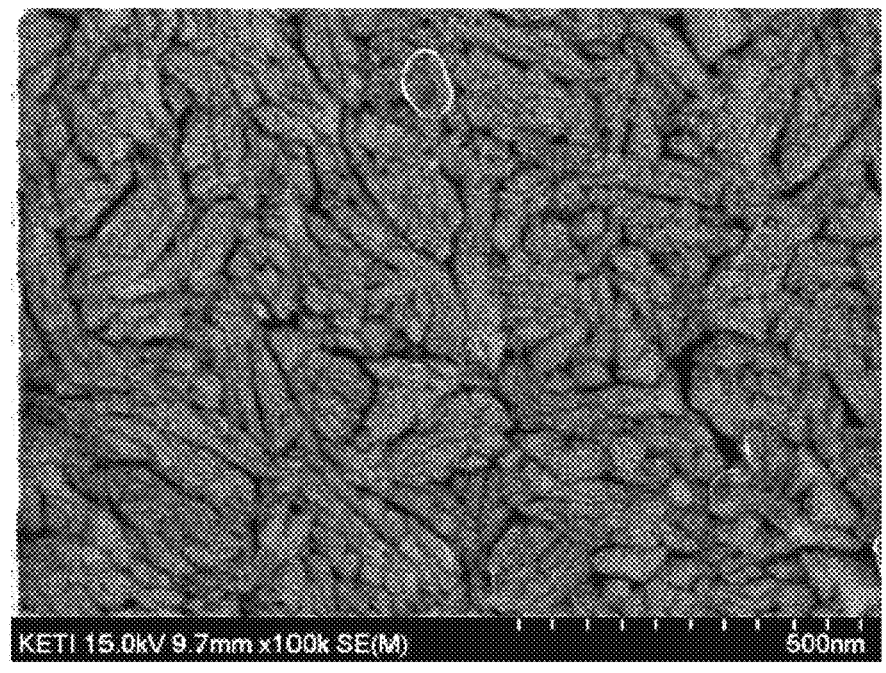
Figure 8B:
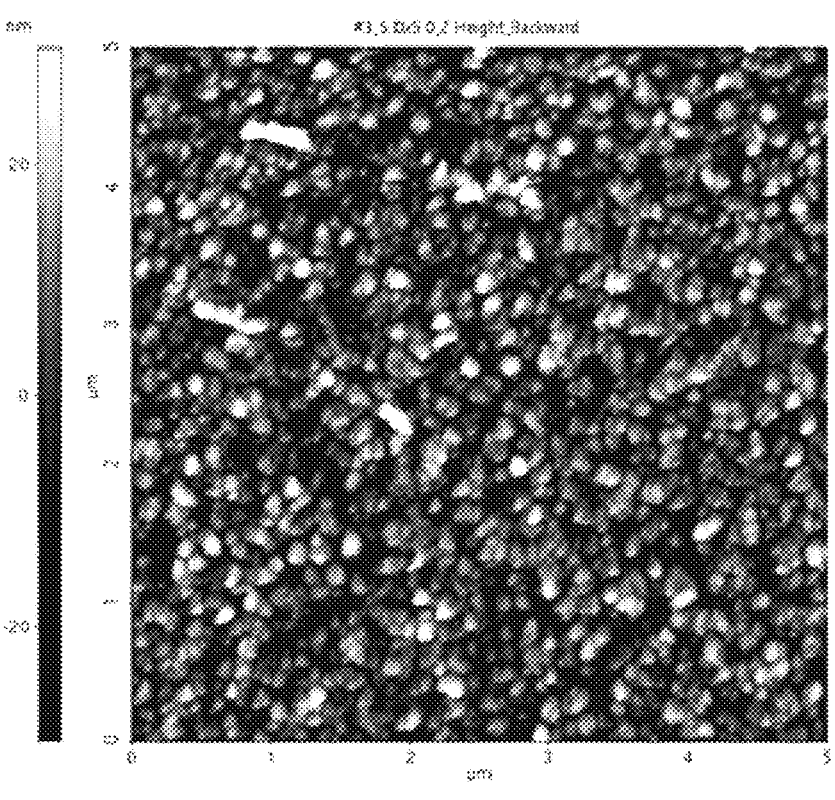
Figure 8B:
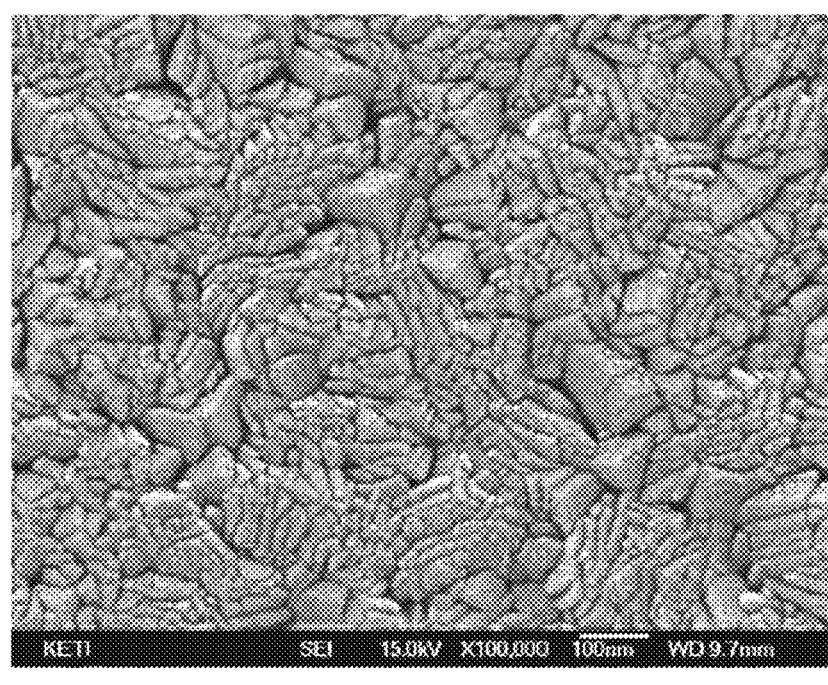
Figure 8C:
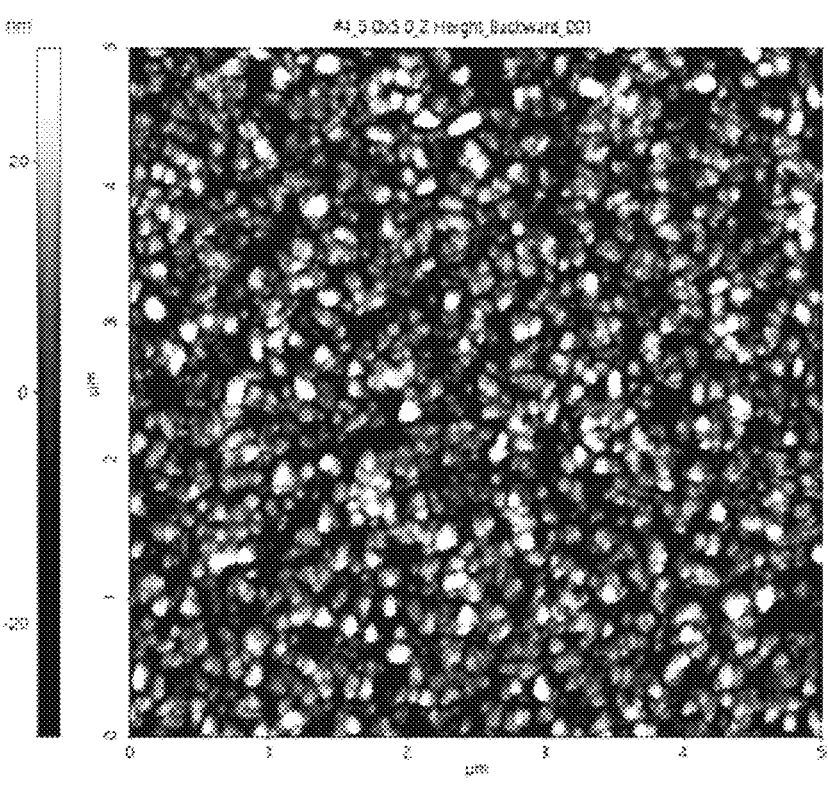
Figure 8C:
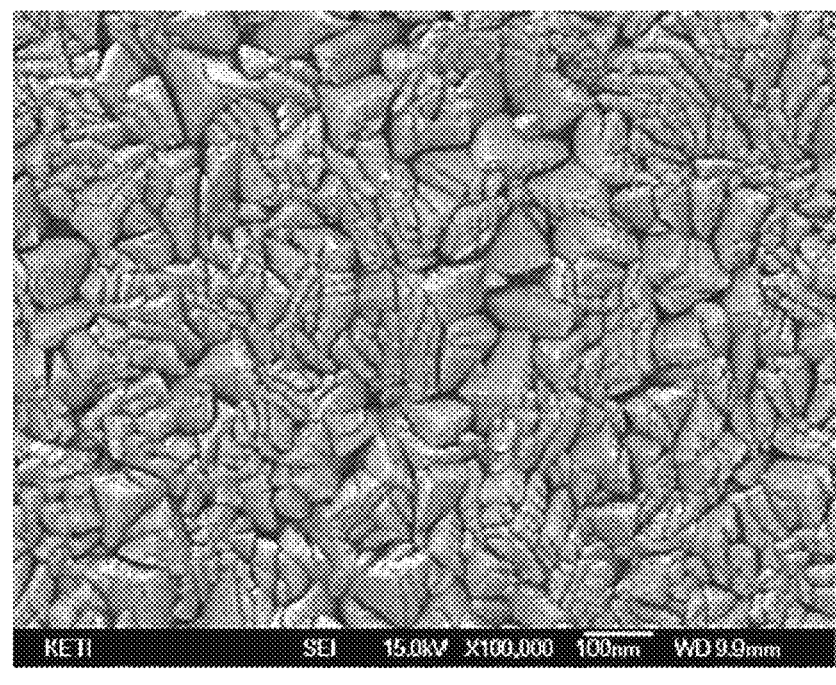

FIG. 8A to FIG. 8C are a scanning electron microscope (SEM) analysis result with respect to AlN thin films manufactured based on the above-mentioned condition 1 to condition 4 and common conditions.

Referring to FIG. 8A to FIG. 8C, FIG. 8A corresponds to the condition 2 (300° C., OV), FIG. 8B corresponds to the condition 3 (300° C., 10V), and FIG. 8C corresponds to the condition 4 (300° C., 30V). In the result of the surface analysis with respect to a manufactured AlN thin film, it may be identified that an AlN(002) surface on the surface of an AlN thin film is formed in a pyramid shape as the strength of an acceleration voltage increases, and also the density thereof is higher.

Therefore, it may be known that the analysis result illustrated in FIG. 8A to FIG. 8C is substantially the same result as the XRD analysis result illustrated in FIG. 5 and the TEM analysis result illustrated in FIG. 7A to FIG. 7C.

Figure 9A:
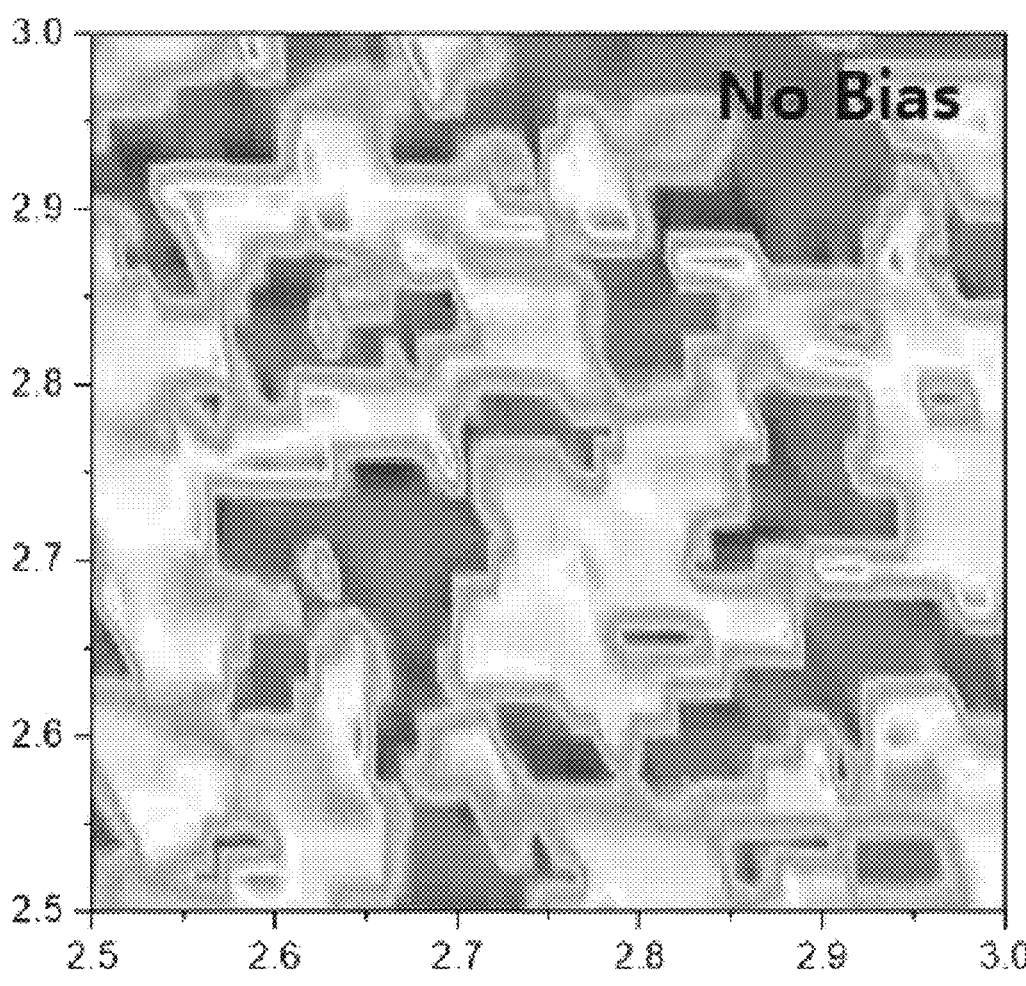
FIG. 9A and FIG. 9B are views showing a polar characteristic of an AlN thin film according to an acceleration voltage applied to a substrate according to an embodiment of the disclosure.
Figure 9B:
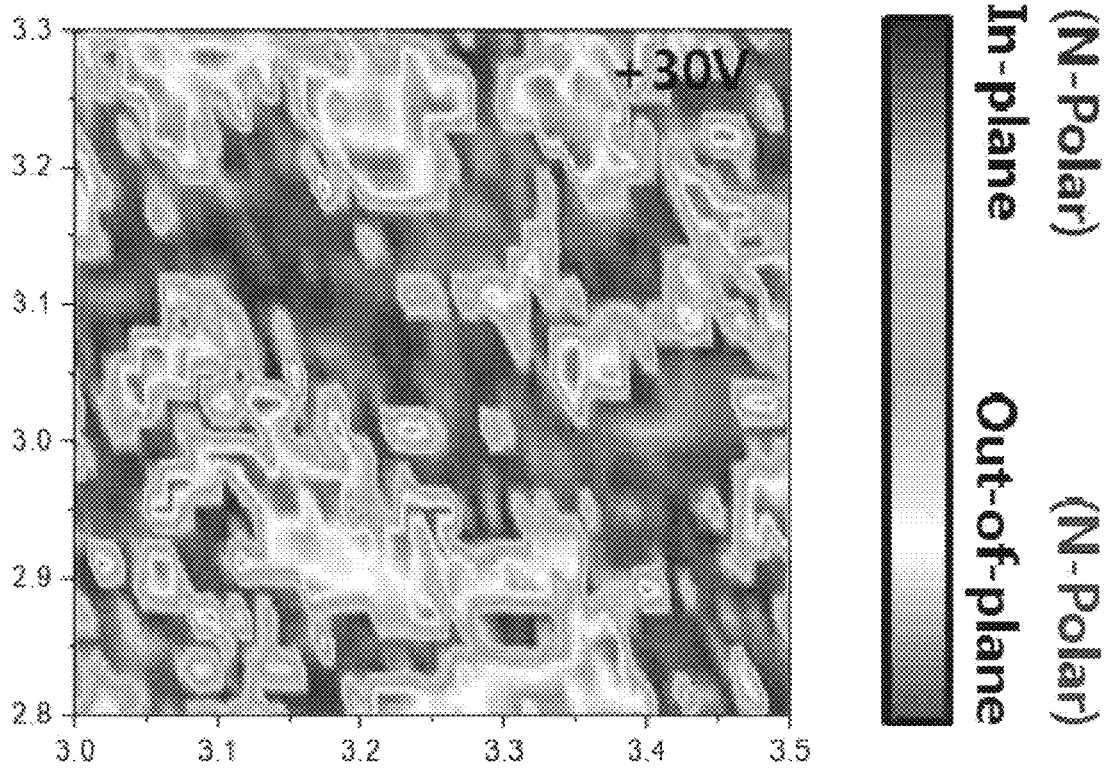
Figure 10:
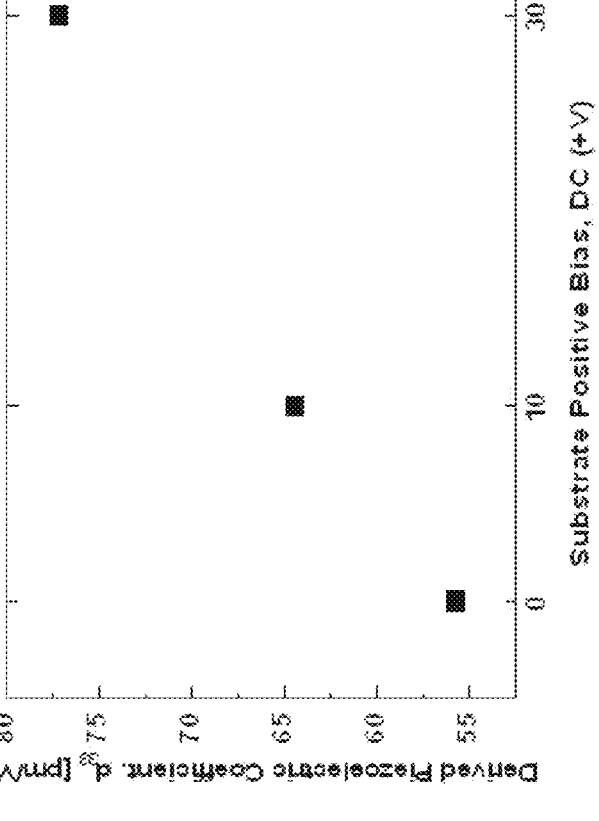
FIG. 10 is a view showing a piezoelectric property of an AlN thin film according to an acceleration voltage applied to a substrate according to an embodiment of the disclosure.
Figure 10:
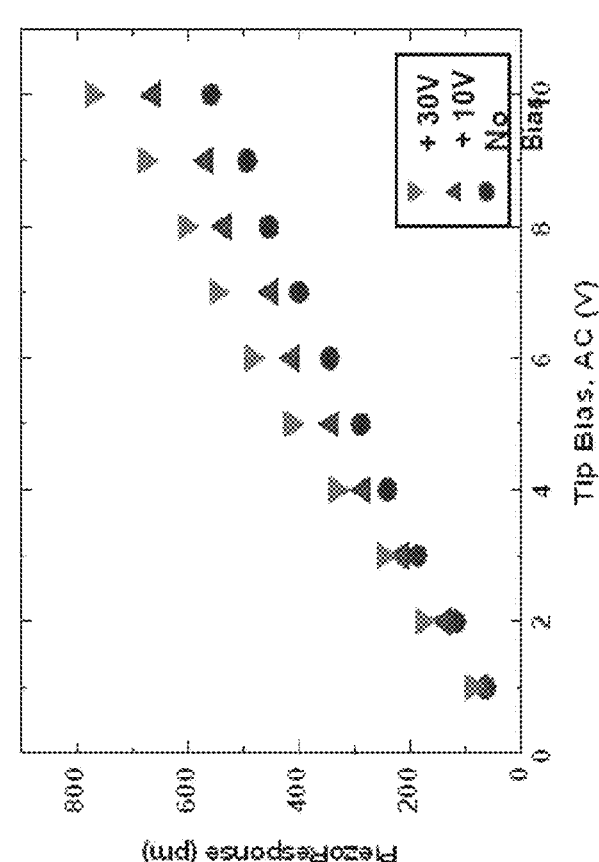

FIG. 9A to FIG. 10 are a pulse frequency modulation (PFM) analysis result with respect to an AlN thin film according to an acceleration voltage applied to a substrate according to an embodiment of the disclosure.

FIG. 9A to FIG. 9B illustrate a polar characteristic of an AlN thin film according to an acceleration voltage applied to a base.

A piezoelectric property of an AlN thin film is configured by the sum of N polar and Al polar in a surface, and the magnitude thereof may be identified through a phase characteristic of PFM. In other words, the sum of characteristics of N polar and Al polar in the surface of an AlN thin film affects the total piezoelectric property of the AlN thin film, and the piezoelectric property of the AlN thin film is more excellent as there are a lot of N polar phase.

Referring to FIG. 9A and FIG. 9B, FIG. 9A corresponds to the case where an acceleration voltage is not applied under the same conditions of manufacturing an AlN thin film, FIG. 9B corresponds to the case where 30 V of an acceleration voltage is applied. When the phase of the surface of an AlN thin film is analyzed with respect to the two cases, it may be identified that the AlN thin film having been deposited in a state where 30V of an acceleration voltage is applied has much more N polar characteristics. It may mean that the piezoelectric property of the AlN thin film of the latter is more excellent than the piezoelectric property of the AlN thin film of the former.

FIG. 10 illustrates an amplitude characteristic of an AlN thin film according to an acceleration voltage applied to a substrate.

Referring to FIG. 9A, FIG. 9B, and FIG. 10 all together, an N polar characteristic is related to an acceleration voltage, and it may be identified that same is proportion to the amplitude result of PFM. It may be identified that the amplitude value of the AlN thin film having been deposited in a state where 30V of an acceleration voltage is continuously applied to a substrate as a bias positive voltage is more excellent.

As described above, through the analysis results with respect to an AlN thin film manufactured under a predetermined condition according to a method of depositing an AlN thin film according to an embodiment of the disclosure, it may be known that a vertically growing AlN(002) surface is obtained by applying an acceleration voltage to a substrate even in a low temperature lower than a temperature compatible with a CMOS process.

According to an embodiment of the disclosure, if the magnitude of an acceleration voltage exceeds 20% of a sputter target power, a plasma may not be generated. Therefore, when an acceleration voltage is in a range of 5-15% of a sputter target power, there is an advantage in that a vertical growth of an AlN(002) surface is preferably achieved, and when an acceleration voltage is in a range of 8-12% of a sputter target power, there is an advantage in that a vertical growth of an AlN(002) surface is more preferably achieved.

According to an embodiment of the disclosure, an acceleration voltage, which corresponds to 10% of a sputter target power, may be applied to a substrate at a low temperature lower than a temperature compatible with a CMOS process, so that an AlN thin film having an excellent piezoelectric property is deposited. For example, the temperature compatible with a CMOS process may be less than 300° C., the AlN thin film having been manufactured under the condition may have a piezoelectric property similar to the AlN thin film having been manufactured at 500° C. without an acceleration voltage.

Various modification examples may be derived from the configuration and method described and exemplified in the specification without departing from the scope of the disclosure. Therefore, the all features included in the detailed description or illustrated in the figures are exemplary features and do not limit the disclosure. Accordingly, the scope of the disclosure is not limited by the exemplary embodiments and should be defined by the appended claims and equivalents thereof.

What is claimed is:

1. A method of depositing an aluminum nitride (AlN) thin film comprising:
   a step of forming an insulating layer on a base substrate;
   a step of removing impurities contained in aluminum (Al) used as a sputtering target by performing pre-sputtering process; and
   a step of depositing an AlN thin film on the insulating layer through a sputtering process,
   wherein the step of depositing the AlN thin film is performed through a continuous deposition type, at a temperature range lower than a CMOS-compatible process temperature, wherein the temperature range is 280° C. to 300° C. and in a state of applying a bias positive voltage to the base substrate such that the AlN thin film has an adjustable deposition thickness configured to be adjusted to a predetermined thickness satisfying vertical growth conditions of an AlN(002) surface of the AlN thin film,
   wherein the applied bias positive voltage is a voltage within a range of 8% to 12% of a power applied to a sputter target for depositing AlN thin film through the sputtering process such that the AlN thin film is vertically grown on the insulating layer,
   wherein at least one region of a metal electrode is formed on only an upper portion of the AlN thin film, and a lower portion of the AlN thin film is free of contact with the metal electrode,
   wherein an oxide film formed on an upper surface of the metal electrode is configured to define three or four regions of the metal electrode
   wherein other regions of the metal electrode are directly formed on a top of the insulating layer of the base substrate, and an upper surface of each of the other regions of the metal electrode is partially covered by the oxide film, and
   wherein a preset value of the power applied to the sputter target is within a range of 250-300W.

2. The method of claim 1, wherein the applied bias positive voltage is a voltage of 10% of the power applied to the sputter target.

3. The method of claim 1, wherein the predetermined thickness of the AlN thin film is at least 1 μm or more.

4. The method of claim 1, wherein the AlN thin film is used for a piezoelectric micromachined ultrasonic transducers (PMUT) sensor.

5. A method of depositing an aluminum nitride (AlN) thin film comprising:

a step of forming an insulating layer on a base substrate;

a step of forming a seed layer for growing an AlN thin film on the insulating layer;

a step of removing impurities contained in aluminum (Al) and molybdenum (Mo) used as a sputtering target by performing pre-sputtering process; and a step of depositing the AlN thin film on the seed layer through a sputtering process, wherein the step of depositing the AlN thin film is performed through a continuous deposition type, at a temperature range lower than a CMOS-compatible process temperature, wherein the temperature range is 280° C. to 300° C. and in a state of applying a bias positive voltage to the base substrate such that the AlN thin film has an adjustable deposition thickness configured to be adjusted to a predetermined thickness satisfying vertical growth conditions of an AlN(002) surface of the AlN thin film, wherein the applied bias positive voltage is a voltage within a range of 8% to 12% of a power applied to a sputter target for depositing AlN thin film through the sputtering process such that the AlN thin film is vertically grown on the insulating layer, wherein at least one region of a metal electrode is formed on only an upper portion of the AlN thin film, and a lower portion of the AlN thin film is free of contact with the metal electrode, wherein an oxide film formed on an upper surface of the metal electrode is configured to define three or four regions of the metal electrode wherein other regions of the metal electrode are in direct contact with the insulating layer, and an upper surface of each of the other regions of the metal electrode is partially covered by the oxide film, and wherein a preset value of the power applied to the sputter target is within a range of 250-300W.

6. The method of claim 5, wherein the applied bias positive voltage is a voltage of 10% of the power applied to the sputter target.

7. The method of claim 5, wherein the predetermined thickness of the AlN thin film is at least 1 μm or more.

8. The method of claim 5, wherein the AlN thin film is used for a piezoelectric micromachined ultrasonic transducers (PMUT) sensor.

* * * * *